United States Patent
Lee et al.

(10) Patent No.: US 7,807,337 B2
(45) Date of Patent: Oct. 5, 2010

(54) INDUCTOR FOR A SYSTEM-ON-A-CHIP AND A METHOD FOR MANUFACTURING THE SAME

(75) Inventors: Hyo-Jong Lee, Seoul (KR); Hong-Seong Son, Suwon-si (KR); Ui-Hyoung Lee, Seoul (KR); Sang-Rok Hah, Seoul (KR); In-Ryong Kim, Suwon-si (KR); Yi-Gwon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 11/968,787

(22) Filed: Jan. 3, 2008

(65) Prior Publication Data

US 2008/0102409 A1 May 1, 2008

Related U.S. Application Data

(62) Division of application No. 10/982,782, filed on Nov. 8, 2004, now abandoned.

(30) Foreign Application Priority Data

Nov. 6, 2003 (KR) .............................. 2003-78195

(51) Int. Cl.
G03F 7/26 (2006.01)
(52) U.S. Cl. .................. 430/315; 430/311; 430/319
(58) Field of Classification Search ............ 430/311, 430/313, 315, 319, 320
See application file for complete search history.

(56) References Cited

U.S. PATENT DOCUMENTS

| | | | |
|---|---|---|---|
| 5,665,251 A * | 9/1997 | Robertson et al. ............ 216/22 |
| 6,010,829 A * | 1/2000 | Rogers et al. ............... 430/316 |
| 6,031,445 A | 2/2000 | Marty et al. |
| 6,326,673 B1 | 12/2001 | Liou |
| 6,368,484 B1 | 4/2002 | Volant et al. |
| 6,872,579 B2 * | 3/2005 | Kamijima ...................... 438/3 |
| 2002/0105405 A1 | 8/2002 | Lee et al. |
| 2003/0003701 A1 * | 1/2003 | Subramanian et al. ...... 438/586 |
| 2003/0122649 A1 | 7/2003 | Jiong et al. |
| 2003/0232493 A1 * | 12/2003 | Mercado et al. ............. 438/614 |
| 2004/0152303 A1 * | 8/2004 | Verbunt ....................... 438/678 |
| 2005/0070090 A1 * | 3/2005 | Lee et al. .................... 438/629 |

FOREIGN PATENT DOCUMENTS

| | | |
|---|---|---|
| CN | 1218284 A | 6/1999 |
| JP | 10241983 A | 9/1998 |
| JP | 2002110453 A | 4/2002 |

(Continued)

*Primary Examiner*—Kathleen Duda
*Assistant Examiner*—Caleen O Sullivan
(74) *Attorney, Agent, or Firm*—Volentine & Whitt, PLLC

(57) ABSTRACT

An inductor for a system-on-a-chip and a method for manufacturing the inductor are disclosed. The inductor comprises a conductive line formed by connecting a plurality of conductive patterns grown from a seed layer formed on a lower wiring. The method comprises using an electrolytic plating process or an electroless plating process to grow the plurality of adjacent conductive patterns from the seed layer until they become connected. The method also enables adjusting the height and width of the conductive line to desired levels.

17 Claims, 21 Drawing Sheets

FOREIGN PATENT DOCUMENTS

| | | |
|---|---|---|
| KR | 199850944 A | 9/1998 |
| KR | 000019683 A | 4/2000 |
| KR | 010036731 A | 5/2001 |
| KR | 1020020076512 A | 10/2002 |
| KR | 1020030002204 A | 1/2003 |
| KR | 1020030020603 A | 3/2003 |
| KR | 10-2004-0058980 * | 7/2004 |

* cited by examiner

US 7,807,337 B2

INDUCTOR FOR A SYSTEM-ON-A-CHIP AND A METHOD FOR MANUFACTURING THE SAME

CROSS-REFERENCE TO RELATED APPLICATION

This is a divisional of application Ser. No. 10/982,782, filed Nov. 8, 2004, which is incorporated herein by reference in its entirety.

BACKGROUND OF THE INVENTION

1. Field of the Invention

The present invention relates generally to an inductor and a method for manufacturing the inductor. More particularly, the present invention relates to an inductor for radio frequency (RF) devices for a system-on-a-chip (SOC), and a method of manufacturing the inductor.

2. Description of the Related Art

A SOC comprises a single microchip integrating together all of the elements of a system. The elements of the system generally comprise independently operating semiconductor devices or circuits. For example, a SOC for wireless communications typically includes a microprocessor, a digital signal processor (DSP), a random access memory (RAM) device, and a read only memory (ROM). Generally, the elements of a SOC are integrated on a large scale integrated (LSI) circuit or an integrated circuit (IC).

In a SOC for RF communication, semiconductor devices and RF circuits are generally integrated on a single chip. Inductors are typically formed on integrated circuits of the SOC after the integrated circuits are formed on a semiconductor substrate. A thin film type inductor having a spiral or solenoid construction is commonly employed in a SOC because it is easily combined with integrated circuits. In addition, thin film type inductors are employed for various devices such as a voltage controlled oscillator (VCO), a filter, or a converter.

A conventional thin film type inductor is disclosed in various international patent publications, including, for example, Korean Laid Open Patent Publication No. 2003-20,603, Korean Patent No. 348,250, and Japanese Laid Open Patent Publication No. 1998-241,983.

FIGS. 1A to 1C are cross-sectional views illustrating a method of manufacturing a conventional inductor disclosed in the above-mentioned Korean Laid Open Patent Publication.

Referring to FIG. 1A, a soft magnetic thin film 15 is formed on a substrate 10 formed on a silicon wafer. Soft magnetic thin film 15 has a double-layer structure comprising an iron-tantalum nitride (FeTaN) layer and a titanium (Ti) layer.

An insulation film 20 of silicon oxide is formed on soft magnetic thin film 15 and a seed layer 25 for an electroplating process is formed on insulation film 20. Seed layer 25 has a double-layer structure comprising a copper (Cu) layer and a chromium (Cr) layer.

A photosensitive film 30 is deposited on seed layer 25, and then a mask 35 is formed over photosensitive film 30. Photosensitive film 30 is exposed through a pattern in mask 35. The pattern of mask 35 defines an inductor having a coil structure.

Referring to FIG. 1B, a plurality of holes are formed through photosensitive film 30 by developing the exposed portions of photosensitive film 30. The holes expose seed layer 25 which is positioned beneath photosensitive film 30. A coil 40 of the inductor is formed from seed layer 25 to fill the holes. Coil 40 is formed by an electroplating process using a plating solution including copper.

Referring to FIG. 1C, photosensitive film 30 is removed and portions of seed layer 25 exposed between the loops of coil 40 are etched away using a wet etching process to complete coil 40 on insulation film 20. Coil 40 is attached to an upper magnetic film 50 using an adhesive film 45 of epoxy resin to form the inductor on substrate 10.

In the above-described method for manufacturing a conventional inductor, the rate at which coil 40 grows from seed layer 25 to fill the holes in photosensitive film 30 decreases significantly as the size of the holes increases. As the width and height of the inductor increase, the rate of coil growth slows accordingly, thus driving up the time and cost of manufacturing for the inductor and the related RF device. However, it is important for the inductor to have sufficient width and height to ensure the desired electrical characteristics of the inductor.

SUMMARY OF THE INVENTION

The present invention provides an inductor for a SOC manufactured according to a simplified process. The present invention also provides a low-cost method for manufacturing an inductor for a SOC using a simplified process.

According to one aspect of the present invention, an inductor comprises a seed layer formed on a substrate and a conductive line formed on the seed layer. The conductive line is formed by connecting a plurality of conductive patterns grown from the seed layer. A diffusion prevention layer is preferably formed between the substrate and the seed layer, and a protection layer is preferably formed on the conductive line. Additionally, a mold layer including hole arrays is preferably filled with the respective conductive patterns.

According to another aspect of the present invention, an inductor comprises a substrate including a conductive structure, a seed layer formed on the substrate, a mold layer formed on the seed layer, and a conductive line formed on the seed layer. The mold layer includes hole arrays exposing the seed layer, and the conductive line is electrically connected to the conductive structure. The conductive line is formed by connecting a plurality of conductive patterns grown from the seed layer. A protection layer is preferably formed on the conductive line.

According to still another aspect of the present invention, an inductor comprises a substrate including a conductive structure, a mold layer including hole arrays having inner surfaces formed on the substrate, a seed layer formed on the inner surfaces of the hole arrays, and a conductive line formed on the seed layer. The conductive line is electrically connected to the conductive structure and is formed by connecting a plurality of conductive patterns grown from the seed layer.

According to still another aspect of the present invention, an inductor comprises a substrate having a conductive structure, a mold layer including hole arrays having inner surfaces formed on the substrate, a first seed layer formed on the inner surfaces of the hole arrays and on the mold layer, a capping layer formed on the first seed layer, a second seed layer formed on portions of the capping layer positioned in the hole arrays, and a conductive line formed on the second seed layer. The conductive line is electrically connected to the conductive structure and is formed by connecting a plurality of conductive patterns grown from the second seed layer.

According to still another aspect of the present invention, there is provided a method for manufacturing an inductor. The method comprises forming a mold layer on a seed layer, wherein the mold layer includes hole arrays exposing the seed layer. The method further comprises forming conductive patterns on the mold layer from the seed layer to fill the hole arrays. The method further comprises forming a conductive line on the mold layer by growing the conductive patterns on the mold layer and connecting the conductive patterns. Preferably, the method further comprises forming an anti-reflective layer on the mold layer and forming a protection layer on the conductive line.

According to still another aspect of the present invention, there is provided a method for manufacturing an inductor. The method comprises forming a mold layer including hole arrays having inner surfaces on a substrate including a conductive structure and forming a diffusion prevention layer on the inner surfaces of the hole arrays and on the mold layer. The method further comprises forming seed layer patterns on portions of the diffusion prevention layer positioned in the hole arrays and forming conductive patterns from the seed layer patterns to fill the hole arrays. The method also further comprises forming a conductive line on the mold layer by growing the conductive patterns on the mold layer and by connecting the conductive patterns and forming a protection layer on the conductive line.

According to still another aspect of the present invention, there is provided a method for manufacturing an inductor. The method comprises forming a mold layer including hole arrays on a substrate including a conductive structure and forming a diffusion prevention layer on the inner surfaces of the hole arrays and on the mold layer. The method further comprises forming a first seed layer on the diffusion prevention layer, forming a capping layer on the first seed layer, and forming second seed layer patterns on portions of the capping layer positioned in the hole arrays. The method further comprises forming conductive patterns from the second seed layer patterns to fill the hole arrays, growing the conductive patterns on the mold layer and connecting the conductive patterns, thereby forming a conductive line on the mold layer, and forming a protection layer on the conductive line.

According to the present invention, an inductor including spiral conductive lines may be readily manufactured at relatively low cost by employing an electrolytic process or an electroless plating process. The width and height of the conductive lines are adjusted to desired values by adjusting the growth rate of the conductive patterns using the electrolytic plating process or the electroless plating process. The desired height of the conductive lines is often relatively high compared to the height of a conventional inductor. Adjusting the height of the conductive lines permits the inductor formed by the present invention to have a relatively high spiral structure on the substrate.

The manufacturing time and cost associated with forming the inductor are reduced by a significant margin because an additional process for electrically connecting the inductor to a lower wiring structure formed on the substrate is not required. Accordingly, the inductor is preferably formed directly on a conventional substrate without any additional process so that an inductor having a relatively high spiral structure is readily formed on the substrate at low cost using conventional manufacturing apparatuses.

BRIEF DESCRIPTION OF THE DRAWINGS

The accompanying drawings illustrate several selected embodiments of the present invention. In the drawings:

FIGS. 3A to 3E illustrate a method for manufacturing the inductor shown in FIG. 2;

DETAILED DESCRIPTION OF THE INVENTION

Figure 1A:
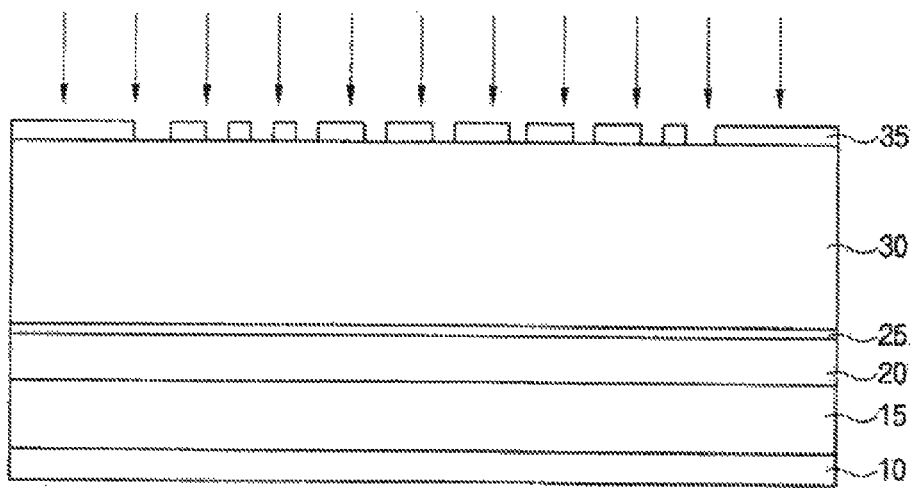
FIGS. 1A to 1C are cross-sectional views illustrating a method for manufacturing a conventional inductor.
Figure 1B:
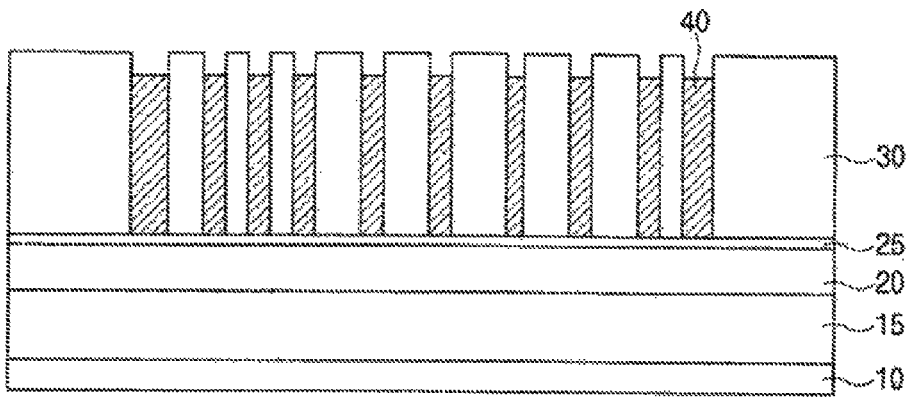
Figure 1C:
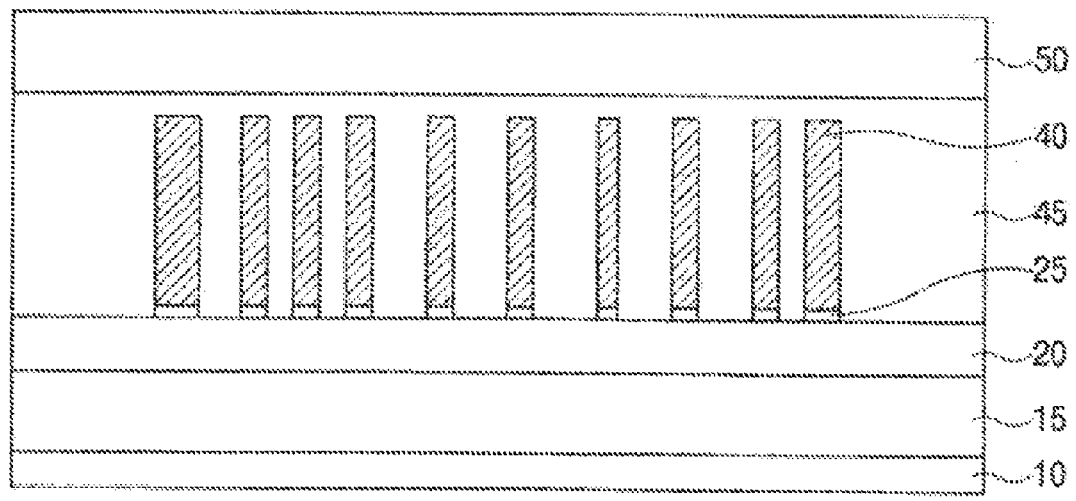

The present invention will now be described more fully with reference to the accompanying drawings, in which several embodiments of the present invention are shown. In the drawings, the thickness of layers and regions are exaggerated for clarity and like reference numerals refer to like elements throughout. It will be understood that when an element such as a layer, region or substrate is referred to as being "on" or "onto" another element, the layer is either directly on the other element or intervening elements may also be present.

Figure 2:
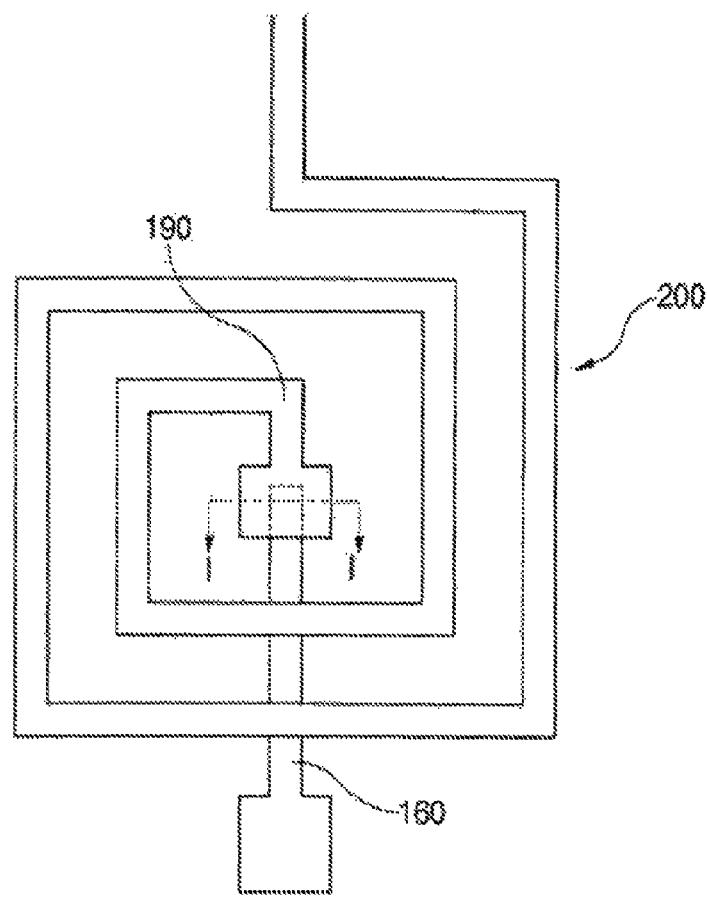
FIG. 2 is a planar view illustrating an exemplary inductor formed in accordance with one aspect of the present invention.

FIG. 2 is a planar view illustrating an inductor according to one aspect of the present invention. In FIG. 2, an inductor 200 includes a spiral conductive line 190. Spiral conductive line 190 is electrically connected to a contact 160 formed as part of a lower wiring element formed on a substrate. Thus, spiral conductive line 190 is positioned over the lower wiring including contact 160 and formed in a spiral structure. Conductive line 190 is preferably formed by connecting a plurality of conductive patterns grown from the seed layer.

Inductor 200 typically includes a seed layer (not shown) formed over the substrate. A multi-layer structure including an insulating interlayer or a conductive layer is typically formed between the substrate and the seed layer.

FIGS. 3A to 3E are cross-sectional views taken along a line extending from I to I' in FIG. 2. FIGS. 3A to 3E illustrate a method for manufacturing the inductor of FIG. 2.

Figure 3A:
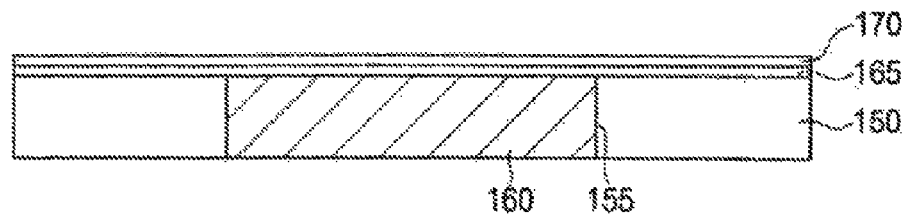
FIGS. 3A to 3E are cross-sectional views of the inductor shown in FIG. 2 taken along the line from I to I' in FIG. 2.

Referring to FIG. 3A, an insulation layer 150 is formed on a substrate (not shown) including a lower conductive structure. An opening 155 is formed through the insulation layer 150 by partially etching insulation layer 150 using a photolithography process. The lower conductive structure typically includes a word line, a bit line, a conductive pattern, and a pad. Opening 155 exposes a portion of a lower wiring (not shown) electrically connected to the lower conductive structure.

A conductive layer is formed on insulation layer 150 to fill opening 155. The conductive layer is typically formed using conductive material such as metal or polysilicon doped with impurities. The conductive layer is partially removed by a chemical mechanical polishing (CMP) process, an etch back process, a combination of a CMP process and an etch back process, or a photolithography process, until insulation layer 150 is exposed. As a result of partially removing the conductive layer, a contact 160 electrically connected to the lower wiring is formed in opening 155. The lower wiring including contact 160 is electrically connected to the lower conductive structure positioned on the substrate.

A diffusion prevention layer 165 is formed on contact 160 and insulation layer 150. Diffusion prevention layer 165 typically has a single-layer structure or a multi-layer structure. The single layer structure typically uses tantalum (Ta), tantalum nitride (TaN), tantalum-aluminum nitride (TaAlN), tantalum silicide ($TaSi_2$), titanium (Ti), titanium nitride (TiN), titanium-silicon nitride (TiSiN), or tungsten nitride (WN). The multi-layer structure typically uses a mixture including at least two elements from the group consisting of tantalum (Ta), tantalum nitride (TaN), tantalum-aluminum nitride (TaAlN), tantalum silicide ($TaSi_2$), titanium (Ti), titanium nitride (TiN), titanium-silicon nitride (TiSiN), and tungsten nitride (WN). Diffusion prevention layer 165 typically has a thickness of about 50 to 1,000 Å. Diffusion prevention layer 165 prevents copper included in a conductive pattern 185 (see FIG. 3C) from diffusing into the underlying structure.

A seed layer 170 is formed on diffusion prevention layer 165. Seed layer 170 is typically formed by a chemical vapor deposition (CVD) process or a physical vapor deposition (PVD) process such as a sputtering process or a vacuum evaporation process. Preferably, seed layer 170 is formed by a PVD process and has a thickness of about 100 to 5,000 Å. Alternatively, seed layer 170 is formed using a conductive material that substantially prevents formation of a surface insulation film such as an oxide film or a nitride film. For example, seed layer 170 is formed using platinum (Pt), palladium (Pd), nickel (Ni), silver (Ag), gold (Au) or an alloy thereof.

Figure 3B:
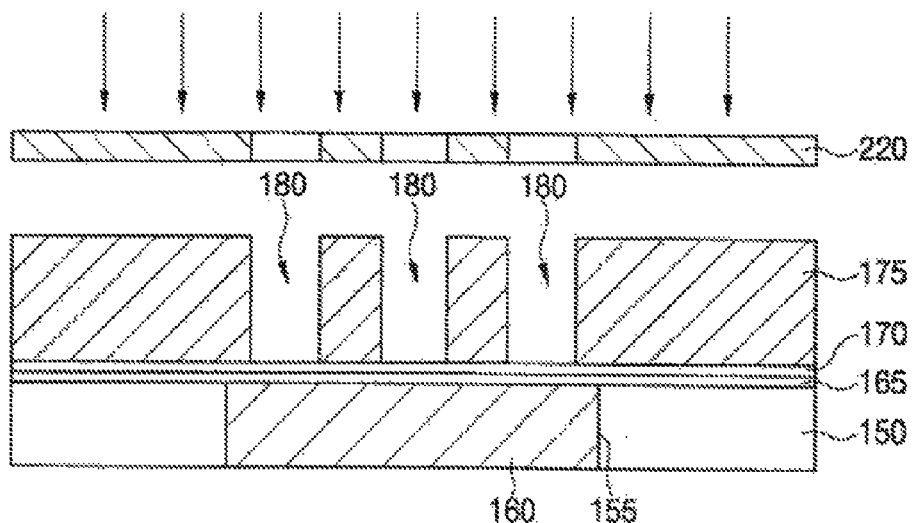

A photoresist film is coated on seed layer 170. The photoresist film is exposed to light through a mask 220 having a plurality of holes as shown in FIG. 3B. The photoresist film serves as a mold layer for forming conductive line 190, as shown in FIG. 3D. The photoresist film typically has a thickness of about 500 to 30,000 Å so as to sufficiently grow conductive patterns 185 (See, FIG. 3C).

Figure 4A:
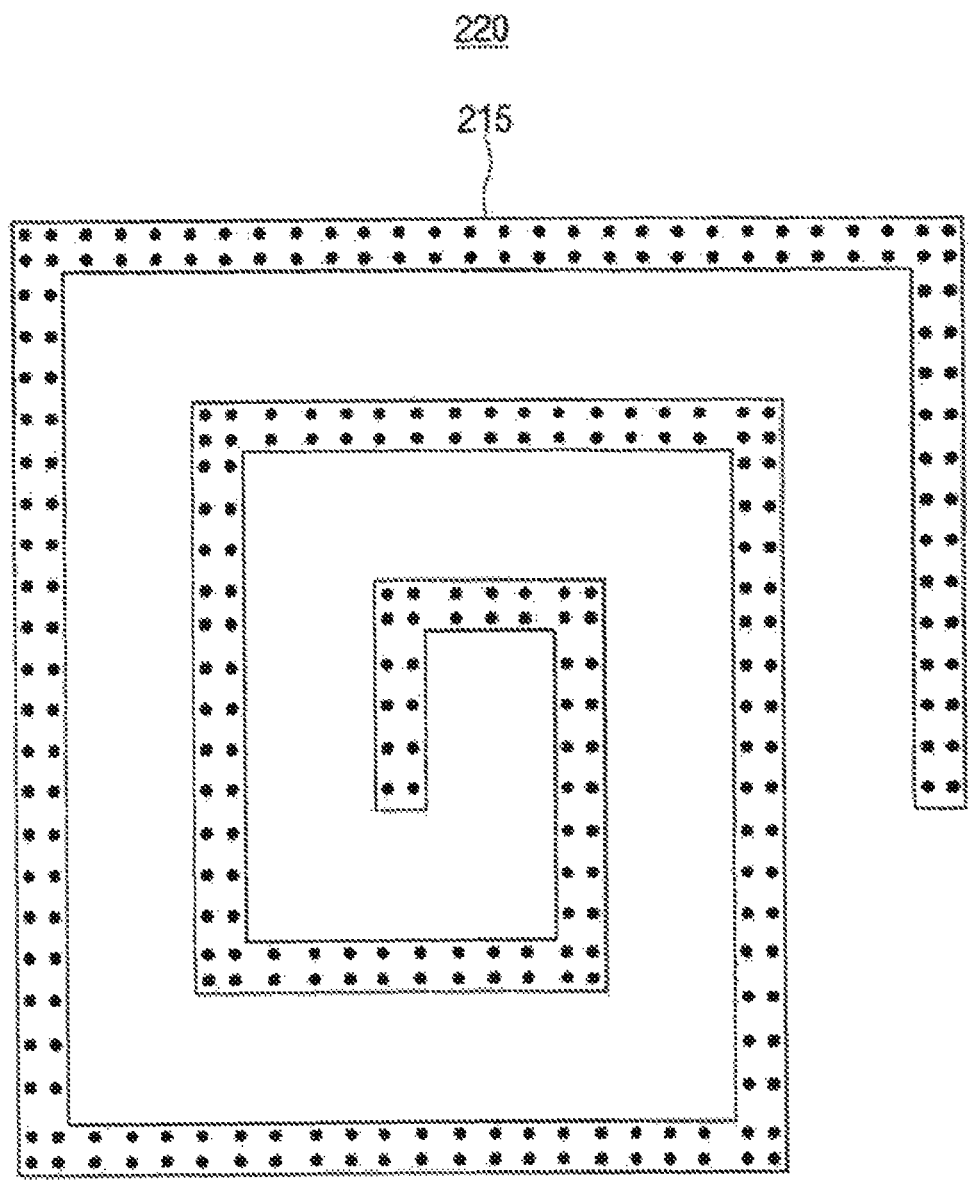
FIG. 4A is a planar view further illustrating the mask element shown in FIG. 3B.

FIG. 4A is a planar view further illustrating mask 220 in FIG. 3B.

Referring to FIGS. 3B and 4A, mask 220 includes a pattern 215 having a plurality of hole arrays arranged in a spiral shape so as to form inductor 200 having conductive lines 190. When the photoresist film is exposed using mask 220, the photoresist film forms a plurality of hole arrays in the spiral shape of mask 220. After the exposed photoresist film is developed, a photoresist pattern 175 including a plurality of trenches or hole arrays 180 arranged in the spiral shape of mask 220 is formed on seed layer 170.

Although FIG. 4 shows a pair of spiral-shaped hole arrays formed in mask 220, the number and size of the hole arrays is variable, and it changes in accordance with the size and structure of inductor 200.

Figure 4B:
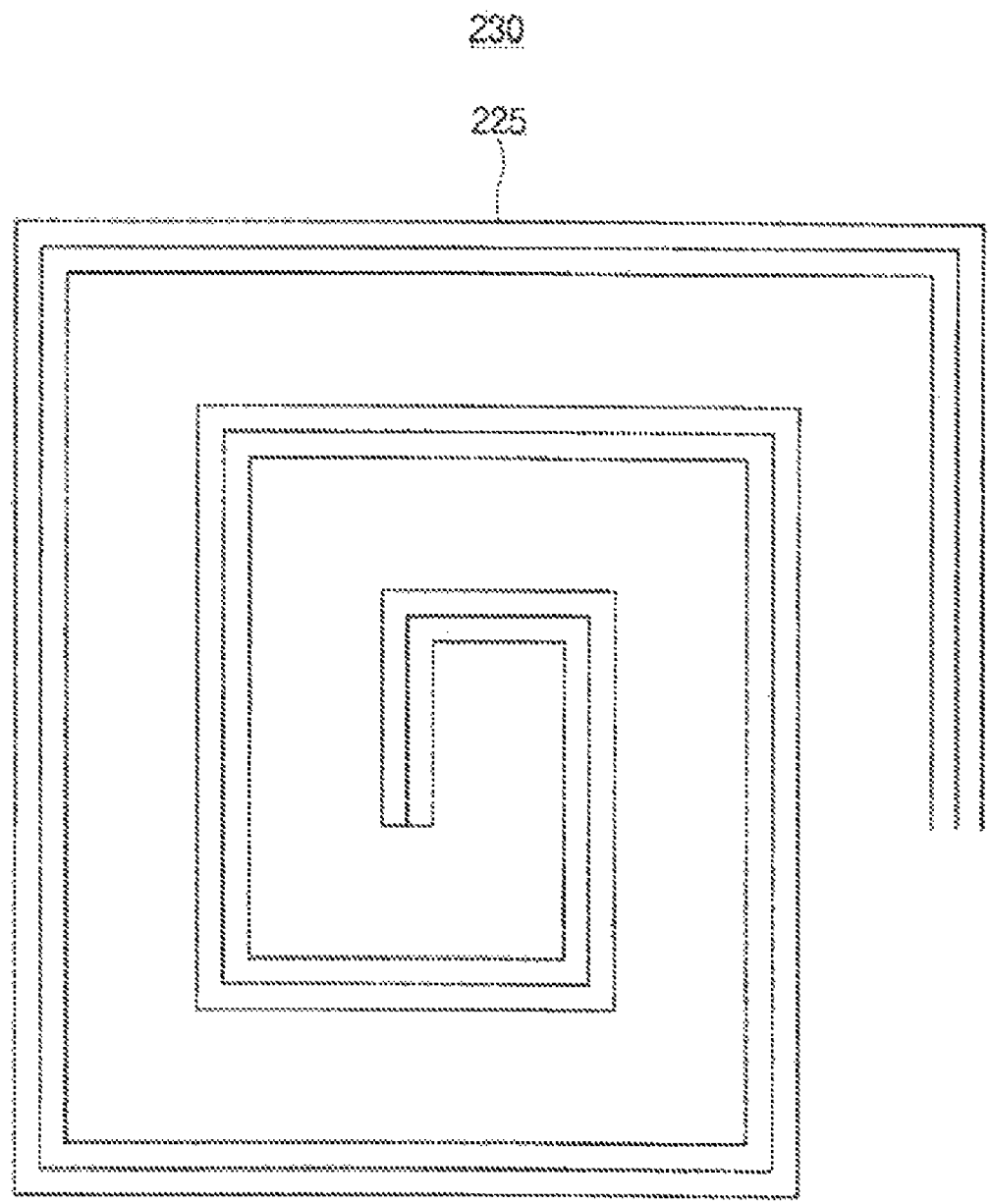
FIG. 4B is a planar view further illustrating a mask for forming conductive patterns according to one aspect of the present invention.

FIG. 4B is a planar view illustrating a mask 230 for forming a conductive line according to one particular embodiment of the present invention.

Referring to FIG. 4B, mask 230 includes a pattern 225 having a plurality of trenches spirally arranged according to a structure of an inductor. The size and number of trenches varies according to the size and structure of the inductor.

Referring now to FIG. 3B, the photoresist film is exposed and developed using mask 220 and as a result, photoresist pattern 175 having hole arrays 180 is formed on seed layer 170. Trenches or hole arrays 180 partially expose seed layer 170. Trenches or hole arrays 180 preferably have a depth of about 500 to 30,000 Å.

According to one aspect of the present invention an anti-reflective layer (ARL) is formed on the photoresist film so as to ensure a process margin in a photolithography process. Photoresist pattern 175 is then formed on seed layer 170 by patterning the photoresist film using the ARL as an etching mask. The ARL typically has a thickness of about 50 to 1,000 Å.

In another aspect of the present invention, an etch-stop layer is formed on seed layer 170 in consideration of a successive etching process. Photoresist pattern 175 is then formed on the etch-stop layer. The etch-stop layer is typically formed using a nitride such as silicon nitride.

Figure 3C:
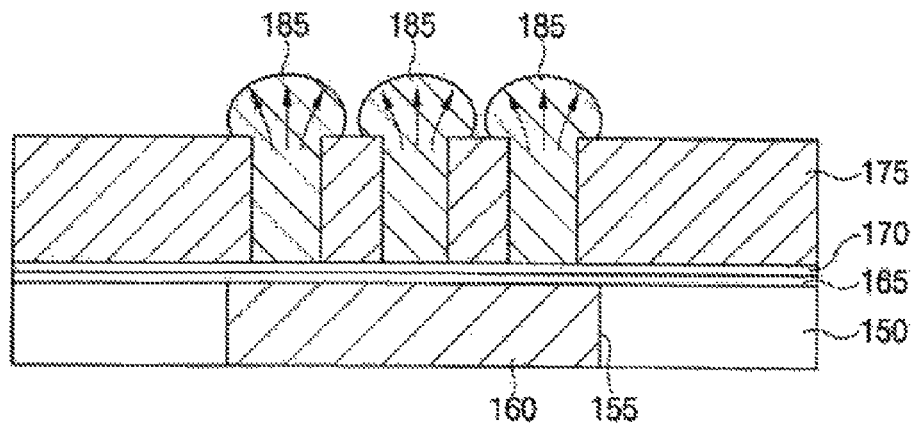
Figure 3D:
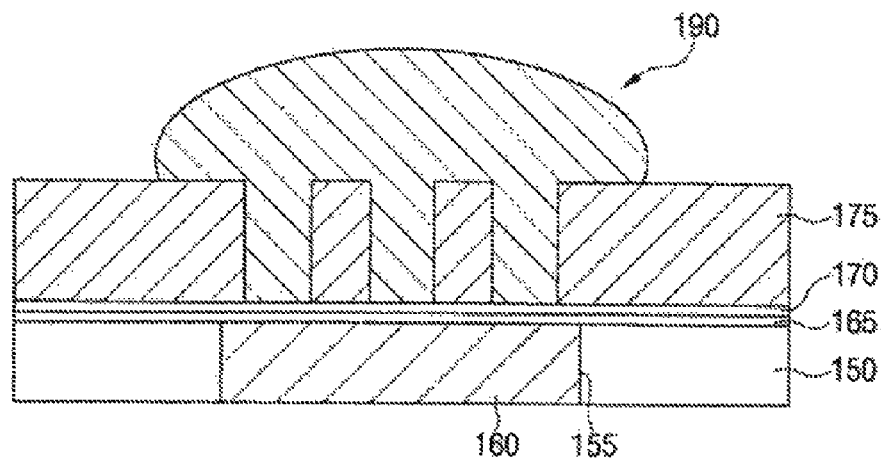

Referring to FIG. 3C, a plurality of conductive patterns 185 is formed on photoresist pattern 175 from seed layer 170 by an electrolytic plating process to fill trenches or hole arrays 180. The electrolytic plating process is typically performed with a current density of about 20 to 40 $mA/cm^2$ using a plating solution including a copper sulfate ($CuSO_4$) solution, a sulfuric acid ($H_2SO_4$) solution, and a solution including chlorine ions ($Cl^-$). Conductive patterns 185 are grown from seed layer 170 in a direction indicated by arrows in FIG. 3C so that upper portions of conductive patterns 185 are formed on photoresist pattern 175. When conductive patterns 185 are grown in hole arrays 180 from seed layer 170, growth within hole arrays 180 accelerates in a vertical direction relative to the substrate, whereas the growth within hole arrays 180 is limited along a horizontal direction relative to the substrate. Once conductive patterns 185 fill the hole arrays, upper portions of conductive patterns 185 form protrusions on photoresist pattern 175.

Referring to FIG. 3D, the electrolytic plating process used to form conductive patterns 185 of FIG. 3C is extended to form conductive line 190 on photoresist pattern 175. In other words, conductive patterns 185 are vertically and horizontally grown on photoresist pattern 175 until conductive patterns 185 become connected to each other, thus forming conductive line 190 on photoresist pattern 175. When conductive line 190 is formed by extending the electrolytic plating process, an upper portion of conductive line 190 typically has a mushroom shape.

A summary of the process used to form conductive line 190, including some additional details, is now given. Conductive patterns 185 are vertically grown from seed layer 170. Next, conductive patterns 185 are horizontally and vertically grown on photoresist pattern 175 as shown in FIGS. 3C and 3D. Then, adjacent conductive patterns 185 are connected to each other on photoresist pattern 175 according to their vertical and horizontal growth, resulting in the formation of conductive line 190. The width and thickness of conductive line 190 are adjusted to desired values by adjusting the vertical and horizontal growth of conductive patterns 185. To achieve this result, the electrolytic plating process is extensively performed to further grow conductive patterns 185 once they have already filled hole arrays 180. The further growth causes adjacent conductive patterns 185 to become connected to each other, thus forming conductive line 190 on photoresist pattern 175. In order to form conductive line 190 with the desired width and thickness, the growth of the conductive patterns 185 is advantageously adjusted after filling hole arrays 180. Conductive line 190 preferably has a thickness of about 1,000 to 100,000 Å. Conductive line 190 typically has a sufficient thickness on photoresist pattern 175 because the horizontal growth of conductive patterns 185 is limited in hole arrays 180.

Figure 3E:
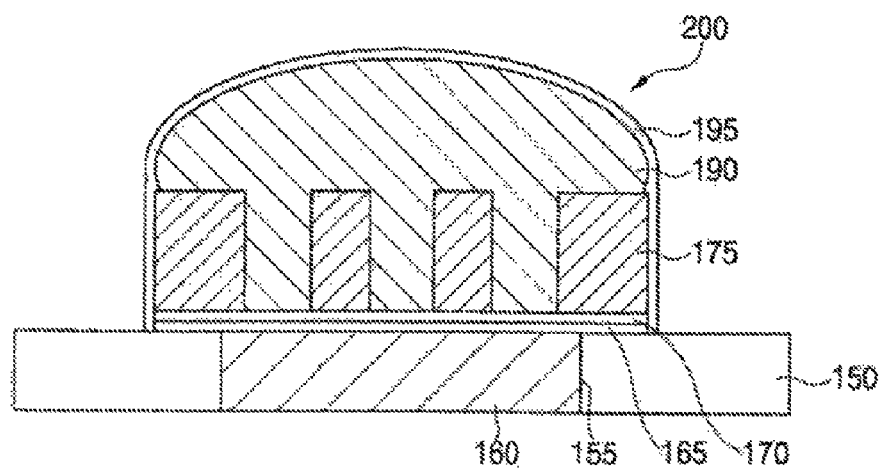

Referring to FIG. 3E, photoresist pattern 175 is partially removed except for a portion of photoresist pattern 175 positioned beneath conductive line 190. When photoresist pattern 175 is partially removed, seed layer 170 is partially exposed. Exposed seed layer 170 and diffusion prevention layer 165 are partially removed to complete conductive lines 190 having spiral structures. Photoresist pattern 175, seed layer 170 and diffusion prevention layer 165 are partially removed by a wet etching process. The wet etching process is executed using an organic stripper, a solution including ozone ($O_3$) at a relatively high concentration, or a standard cleaning (SC) solution including carbon dioxide ($CO_2$). Alternatively, photoresist pattern 175 may be partially removed by an ashing process and/or a stripping process. In one embodiment of the present invention, seed layer 170 and diffusion prevention layer 165 may be partially removed using a mixture of a hydrogen fluoride (HF) solution and a hydrogen peroxide ($H_2O_2$) solution or a mixture of a hydrogen fluoride (HF) solution and a nitric acid ($HNO_3$) solution. When the ARL is formed on photoresist pattern 175, the ARL and photoresist pattern 175 are simultaneously removed.

A protection layer 195 is formed to enclose conductive line 190, thereby completing inductor 200, which preferably comprises a plurality of conductive lines 190. Inductor 200 has a spiral structure formed by the plurality of conductive lines 190. Protection layer 195 is typically formed using silicon carbide (SiC) or silicon nitride (SiN). Alternatively, protection layer 195 has a multi-layer structure including at least two films of silicon carbide, silicon nitride and silicon oxycarbide. Protection layer 195 preferably has a thickness of about 100 to 1,000 Å. Protection layer 195 is formed on a sidewall of a remaining portion of diffusion prevention layer 165, a sidewall of a remaining portion of seed layer 170, a sidewall of a remaining portion of photoresist pattern 175, and on conductive lines 190 of the spiral structure.

Figure 5A:
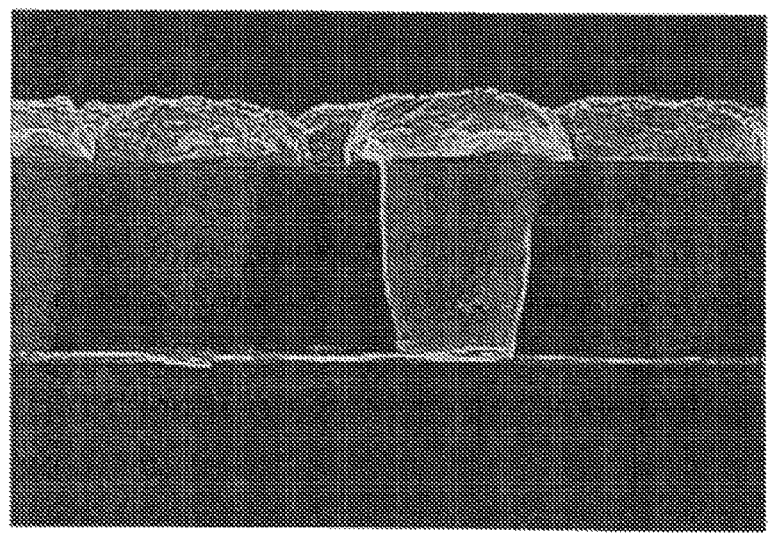
FIG. 5A is an electron micrograph image illustrating cross-sections of the conductive patterns in FIG. 3C.
Figure 5B:
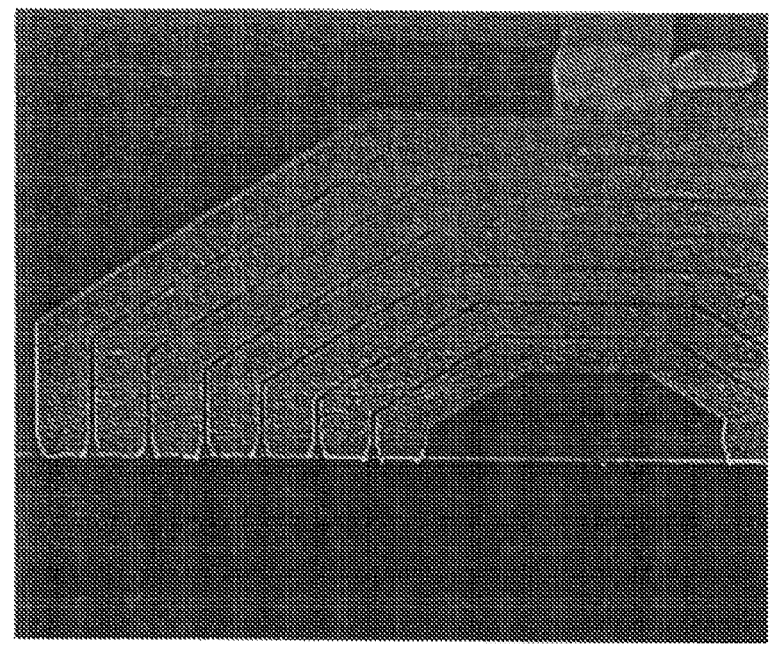
FIG. 5B is an electron micrograph image illustrating a planar view of the inductor in FIG. 3E.

FIG. 5A is an electron micrograph image displaying cross sections of conductive patterns in FIG. 3C. FIG. 5B is an electron micrograph image showing a plan view of the inductor in FIG. 3E.

Referring to FIGS. 5A and 5B, conductive patterns 185 are vertically and horizontally grown by the above-described electrolytic plating process to form inductor 200 including spiral conductive lines 190 on photoresist pattern 175. Each of the conductive patterns 185 has an upper portion with a mushroom shape.

Figure 6:
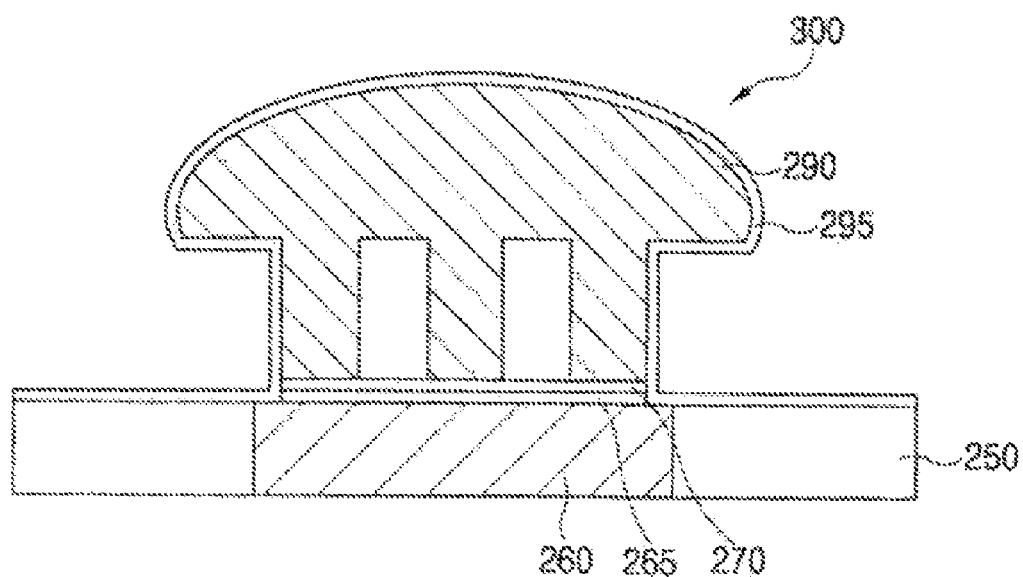
FIG. 6 is a cross-sectional view illustrating an exemplary inductor according to another aspect of the present invention.

FIG. 6 is a cross sectional view illustrating an inductor according to one aspect of the present invention. According to this aspect, a method for manufacturing conductive lines comprises processes identical to the processes described with reference to FIGS. 3A to 3D.

Referring to FIG. 6, a method for manufacturing an inductor 300 is described. Inductor 300 is manufactured on a substrate having an insulation layer 250, which has a contact 260 running through it as previously described. A photoresist pattern for forming conductive lines 290 is completely removed and a seed layer 270 and a diffusion prevention layer 265 are partially removed. Thus, lower portions of conductive lines 290 are exposed.

A protection layer 295 is formed on insulation layer 250, on sidewalls of exposed seed layer 270 and diffusion prevention layer 265, and on conductive lines 290. Protection layer 295 typically has a single-layer structure of silicon carbide, silicon oxycarbide, or silicon nitride or a multi-layer structure having layers chosen from the group consisting of silicon carbide, silicon oxycarbide and silicon nitride. Protection layer 295 is formed from the upper portions of conductive lines 290 to insulation layer 265 to thereby entirely enclose conductive lines 290.

FIGS. 7A to 7E are cross-sectional views illustrating a method of manufacturing the inductor in FIG. 6. In FIGS. 7A to 7E, a substrate including a lower conductive structure having word lines, bit lines and pads is not shown.

Figure 7A:
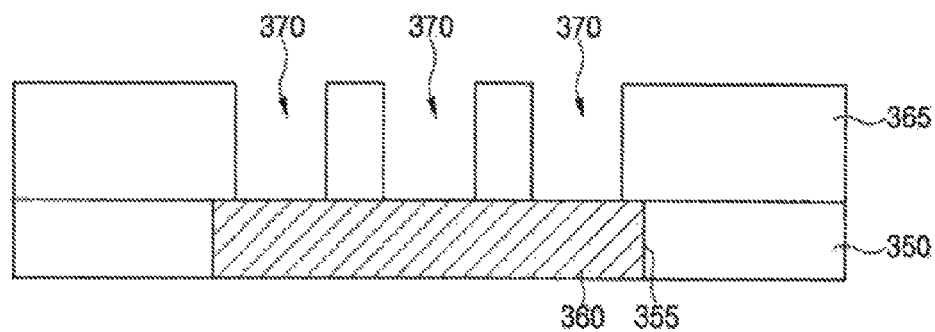
FIGS. 7A to 7E are cross-sectional views illustrating a method for manufacturing the exemplary inductor in FIG. 6.

Referring to FIG. 7A, an insulation layer 350 is formed on the substrate. Insulation layer 350 is partially etched to form an opening 355 that exposes a lower wiring electrically connected to the lower conductive structure.

A conductive layer is formed on insulation layer 350 to fill opening 355. The conductive layer may be formed using metal or doped polysilicon. The conductive layer is then partially removed by a CMP process, an etch back process or a combination of a CMP process and an etch back process. The conductive layer is partially removed until insulation layer 350 is exposed. Thus, a contact 360 electrically connected to the lower wiring is formed in opening 355. The lower wiring including contact 360 is electrically connected to the lower conductive structure formed on the substrate.

A mold layer 365 is formed on insulation layer 350 and contact 360. Mold layer 365 may be formed using oxide or photoresist. Mold layer 365 is partially etched to form a plurality of trenches or hole arrays 370 that expose contact 360 as described above. Mold layer 365 typically has a thickness of about 500 to 30,000 Å so as to easily form a conductive line 400 (see FIG. 7D) and to sufficiently isolate the lower conductive structure from conductive line 400.

When mold layer 365 is formed using oxide, a photoresist film is additionally formed on mold layer 365. The photoresist film is exposed using the mask shown in FIG. 4A or FIG. 4B to form a photoresist pattern including a plurality of hole arrays or trenches. After an ARL having a thickness of about 50 to 1,000 Å is additionally formed on the photoresist film, the photoresist pattern is formed on mold layer 365. Subsequently, mold layer 365 is etched using the photoresist pattern as an etching mask to thereby form trenches or hole arrays 370 having depth of about 500 to 1,000 Å through mold layer 365.

When mold layer 365 is formed using photoresist, mold layer 365 is preferably directly exposed using the mask in FIG. 4A or FIG. 4B to thereby form trenches or hole arrays 370 through mold layer 365, wherein trenches or hole arrays 370 have inner surfaces.

Figure 7B:
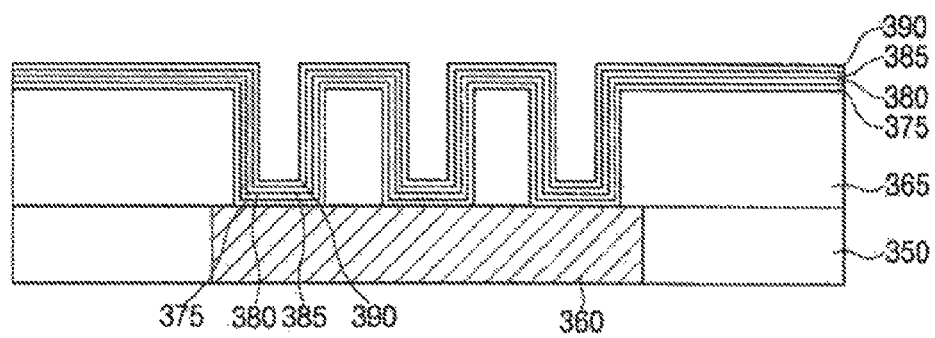

Referring to FIG. 7B, a diffusion prevention layer 375 is formed on mold layer 365, on contact 360, and on the inner surfaces of trenches or hole arrays 370. Diffusion prevention layer 375 has a thickness of about 50 to 1,000 Å. Diffusion prevention layer 375 typically has a single-layer structure or a multi-layer structure. The single-layer structure typically includes tantalum, tantalum nitride, tantalum-aluminum nitride, tantalum-silicon nitride, tantalum silicide, titanium, titanium nitride, tungsten nitride, titanium-silicon nitride, or an alloy thereof. The multi-layer structure typically includes at least two elements from the group consisting of tantalum, tantalum nitride, tantalum-aluminum nitride, tantalum-silicon nitride, tantalum silicide, titanium, titanium nitride, tungsten nitride, titanium-silicon nitride, and any alloy thereof.

A first seed layer 380 is formed on diffusion prevention layer 375 by a CVD process or a PVD process such as a sputtering process or a vacuum evaporation process. First seed layer 380 has a thickness of about 100 to 5,000 Å. First seed layer 380 is preferably formed using copper, platinum, palladium, nickel, silver, gold, or an alloy thereof.

A capping layer 385 is formed on first seed layer 380 using a metal such as aluminum. Capping layer 385 has a thickness of about 100 to 500 Å. When a portion of a second seed layer 390 on mold layer 365 is removed, a metal oxide film is formed on capping layer 385 as a result of oxidation in metal in the capping layer 385. That is, an upper portion of capping layer 385 except capping layer 385 formed in hole arrays 370 is converted into an insulation film of metal oxide so that capping layer 385 may selectively restrain growth of conductive patterns 395. (See, FIG. 7C). Therefore, conductive patterns 395 may rapidly grow in hole arrays 370, whereas conductive patterns 395 may slowly grow on the metal oxide film of capping layer 385. Second seed layer 390 is formed on capping layer 385 using copper, platinum, palladium, nickel, silver, gold or an alloy thereof.

Figure 7C:
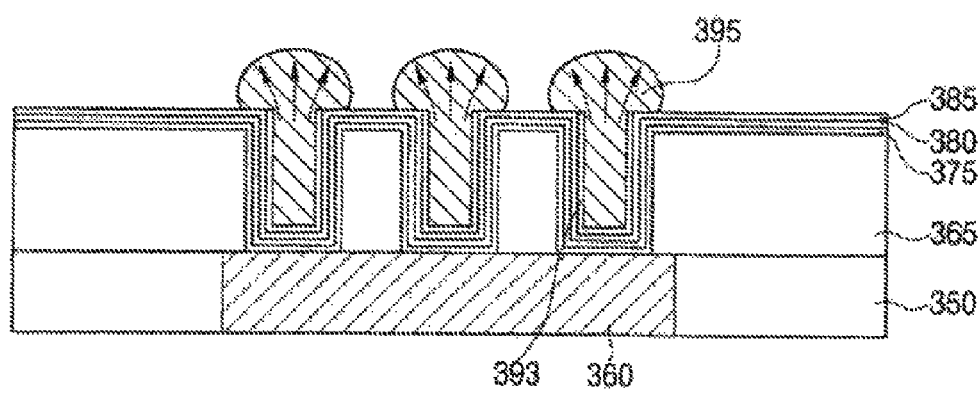

Referring to FIG. 7C, to perform a selective electrolytic plating process, a portion of second seed layer 390 positioned on mold layer 365 is removed by a CMP process, an etch back process or a combination of a CMP process and an etch back process. As a result, second seed layer patterns 393 are formed on the inner surfaces of hole arrays 370. Diffusion prevention layer 375, first seed layer 380, capping layer 385 and second seed layer patterns 393 are successively formed on the inner surfaces of hole arrays 370, whereas second seed layer patterns 393 are not formed on mold layer 365.

Conductive patterns 395 selectively and vertically grow from the second seed layer patterns 393 to fill the hole arrays 370 using the selective electrolytic plating process. The selective electrolytic plating process is carried out with a current density of about 20 to 40 mA/cm$^2$ using a plating solution that includes a copper sulfate solution, a sulfuric acid solution, and a solution including chlorine ions. As described above, since the horizontal growth of the conductive patterns 395 is limited in the hole arrays 370, conductive patterns 395 are vertically grown from second seed layer patterns 393 in hole arrays 370. When the selective electrolytic plating process is continually performed, conductive patterns 395 filling hole arrays 370 grow horizontally and vertically on mold layer 365. Capping layer 385 including the metal oxide film restrains the horizontal growth of conductive patterns 395 in hole arrays 370. However, because a bottleneck structure is formed at upper portions of hole arrays 370 due to capping layer 385, conductive patterns 395 grow horizontally and vertically after hole arrays 370 are filled with conductive patterns 395. Conductive patterns 395 filling hole arrays 370 continuously grow in horizontal and vertical directions as indicated by arrows so that adjacent conductive patterns 395 become connected to one another to form conductive line 400 having a desired width and height.

Figure 8:
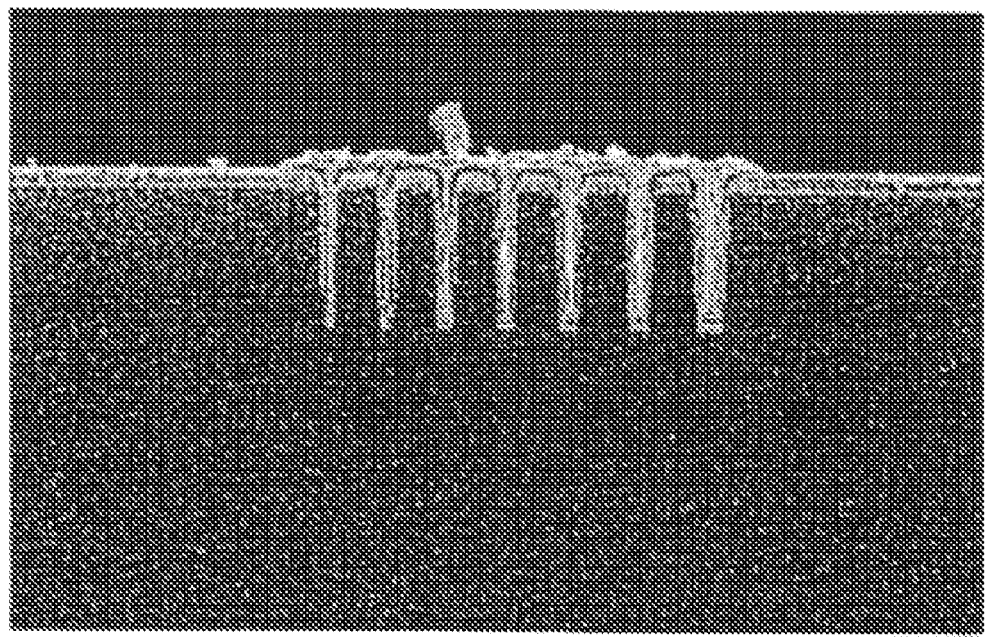
FIG. 8 is an electron micrograph image illustrating cross-sections of conductive patterns in FIG. 7C.

FIG. 8 is an electron micrograph image displaying cross-sections of conductive patterns in FIG. 7C.

As shown in FIGS. 7C and 8, although the horizontal growth of conductive patterns 395 is restrained in hole arrays 370, conductive patterns 395 grow both vertically and horizontally after filling hole arrays 370. As a result, adjacent conductive patterns 395 become connected to one another, thereby forming conductive line 400.

Figure 7D:
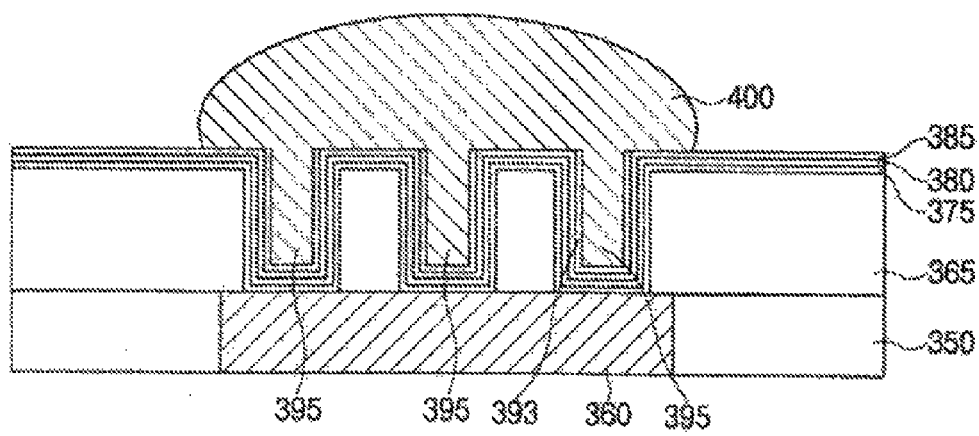

Referring to FIG. 7D, conductive line 400 having a desired width and height is formed on mold layer 365 from second seed layer patterns 393 by connecting adjacent conductive patterns 395. Conductive patterns 395 are connected by continuously performing the electrolytic plating process. After conductive patterns 395 fill hole arrays 370, the growth rate of conductive patterns 395 may be advantageously adjusted to form conductive line 400 having a height of about 1,000 to 100,000 Å.

Figure 7E:
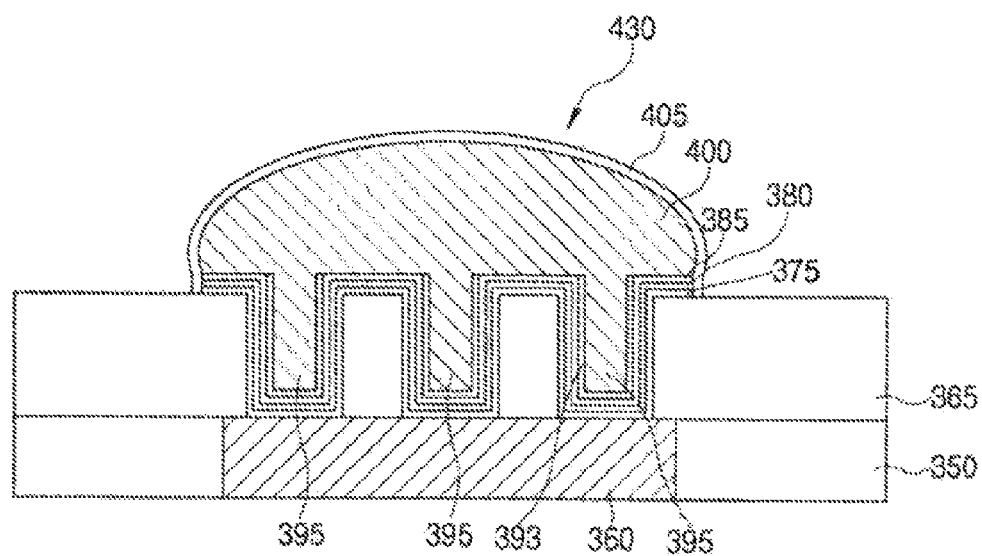

Referring to FIG. 7E, capping layer 385, first seed layer 380 and diffusion prevention layer 375 are partially removed except for portions covered by conductive line 400. A protection layer 405 is formed to cover conductive line 400, thereby forming an inductor 430 having a spiral structure including a plurality of conductive lines 400. Capping layer 385, first seed layer 380 and diffusion prevention layer 375 may be partially removed using a mixture of a hydrogen fluoride solution and a hydrogen peroxide solution, or a mixture of a hydrogen fluoride solution and a nitric acid solution.

In one embodiment of the present invention, after mold layer 365 is removed, protection layer 405 is formed on conductive line 400. When the mold layer 365 is formed using photoresist, mold layer 365 is preferably removed using an organic stripper, a solution including ozone at relatively high concentration, or an SC solution including carbon dioxide. When the mold layer 365 is formed using oxide, the mold layer 365 is preferably removed by a wet etching process using a sulfuric acid solution or a dry etching process such as a reactive ion etching process or a plasma etching process.

Referring now to FIG. 7E, protection layer 405 is preferably formed using silicon carbide or silicon nitride. Protection layer 405 has a thickness of about 100 to 1,000 Å. Protection layer 405 encloses exposed sidewalls of the capping layer 385, first seed layer 380 and diffusion prevention layer 375 beneath conductive line 400.

In one embodiment of the present invention, protection layer 405 has a multi-layer structure including at least elements from the group consisting of silicon carbide, silicon nitride and silicon oxycarbide.

FIGS. 9A through 9E are cross-sectional views illustrating a method of manufacturing an inductor according to one aspect of the present invention.

Figure 9A:
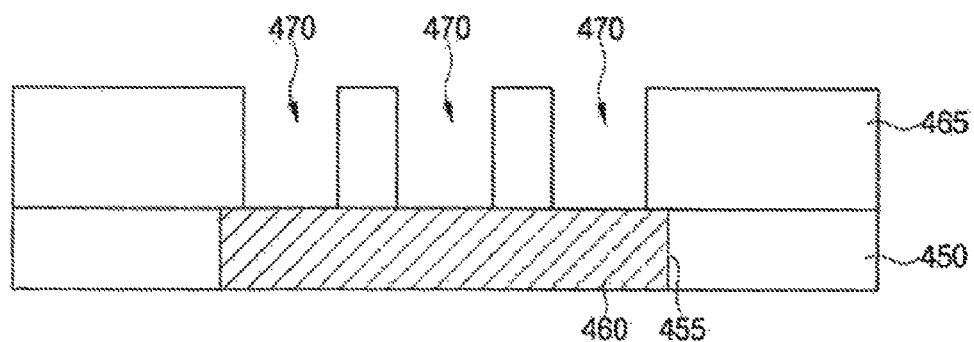
FIGS. 9A to 9E are cross-sectional views illustrating a method for manufacturing an inductor according to yet another aspect of the present invention.

Referring to FIG. 9A, an insulation layer 450 is formed on a substrate including a lower conductive structure. Insulation layer 450 is preferably formed using oxide or nitride. Insulation layer 450 is partially etched by a photolithography process and then an opening 455 is formed through insulation layer 450. The lower conductive structure typically includes word lines, bit lines and pads. Opening 455 exposes a lower wiring electrically connected to the lower conductive structure.

A conductive layer of metal or doped polysilicon is formed on the insulation layer 450 to fill opening 455. The conductive layer is partially removed by a CMP process, an etch back process, or a combination of a CMP process and an etch back process, thereby forming a contact 460 in opening 455. Contact 460 is electrically connected to the lower wiring. Hence, the lower wiring including contact 460 is electrically connected to the lower conductive structure.

A mold layer 465 having a thickness of about 500 to 30,000 Å is formed on insulation layer 450 and contact 460. Mold layer 465 may be formed using oxide or photoresist. Mold layer 465 is partially etched to form a plurality of trenches or hole arrays 470 exposing contact 460 as described above. Trenches or the hole arrays 470 have depth of about 1,000 to 30,000 Å.

When mold layer 465 is formed using oxide, a photoresist film is additionally formed on mold layer 465. The photoresist film is exposed using one of the masks shown in FIG. 4A and FIG. 4B to form a photoresist pattern including a plurality of hole arrays or trenches. An ARL having a thickness of about 50 to 1,000 Å is typically also formed on the photoresist film and then the photoresist pattern is formed on mold layer 465. Subsequently, mold layer 465 is etched using the photoresist pattern as an etching mask to thereby form trenches or hole arrays 470 through mold layer 465.

When mold layer 465 is formed using photoresist, mold layer 465 is preferably directly exposed using one of the masks in FIG. 4A and FIG. 4B without forming an additional photoresist film, thereby forming the trenches or hole arrays 470 through mold layer 465, wherein trenches or hole arrays 470 have inner surfaces. An additional ARL is preferably formed on mold layer 465 to ensure a process margin for a photolithography process.

Figure 9B:
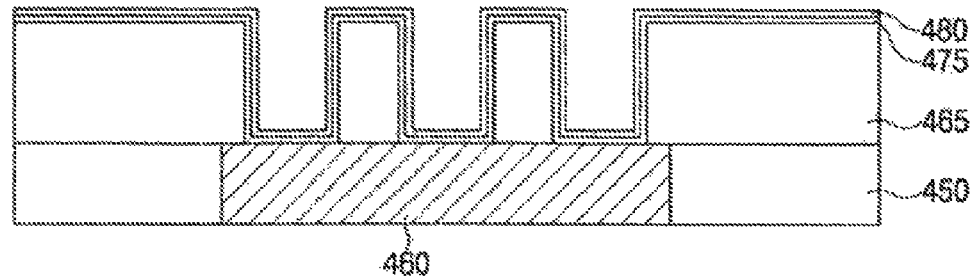

Referring to FIG. 9B, a diffusion prevention layer 475 having a thickness of about 50 to 1,000 Å is formed on mold layer 465, on contact 460 and on the inner surfaces of hole arrays 470. Diffusion prevention layer 475 typically has a single-layer structure or a multi-layer structure. The single-layer structure typically includes tantalum, tantalum nitride, tantalum-aluminum nitride, tantalum-silicon nitride, tantalum silicide, titanium, titanium nitride, tungsten nitride, titanium-silicon nitride, or an alloy thereof. The multi-layer structure typically includes at least two elements from the group consisting of tantalum, tantalum nitride, tantalum-aluminum nitride, tantalum-silicon nitride, tantalum silicide, titanium, titanium nitride, tungsten nitride, titanium-silicon nitride, and any alloy thereof.

A seed layer 480 having a thickness of about 100 to 5,000 Å is formed on diffusion prevention layer 475 by a CVD process or a PVD process such as a sputtering process or a vacuum evaporation process. Seed layer 480 is preferably formed using copper, platinum, palladium, nickel, silver, gold, or an alloy thereof.

Figure 9C:
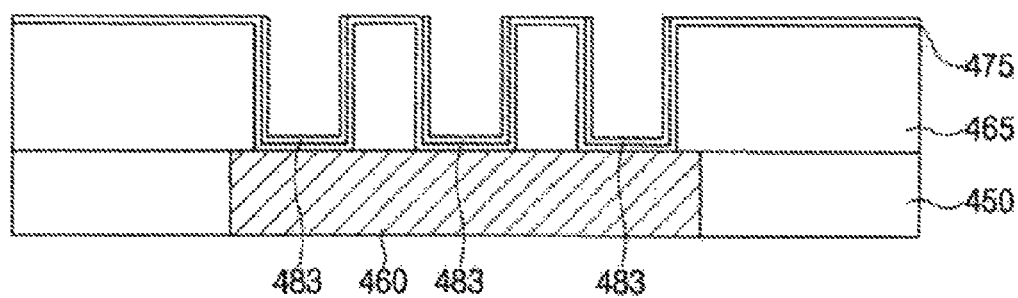

Referring to FIG. 9C, seed layer patterns 483 are formed on contact 460 and on diffusion prevention layer 475 positioned on the inner surfaces of hole arrays 470 to achieve a selective electroless plating process. Seed layer patterns 483 are formed by partially removing seed layer 480 using a CMP process, an etch back process or a combination of a CMP process and an etch back process until diffusion prevention layer 475 is exposed. As a result, diffusion prevention layer 475 and seed layer patterns 483 are positioned on the inner surfaces of hole arrays 470, whereas only diffusion prevention layer 475 is positioned on mold layer 465.

Figure 9D:
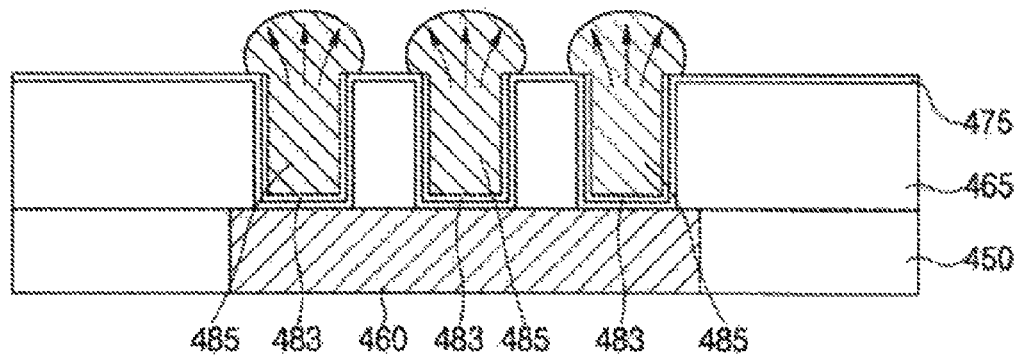

Referring to FIG. 9D, using the selective electroless plating process, conductive patterns 485 are formed from the seed layer patterns 483 to fill hole arrays 470. The electroless plating process is carried out using a copper sulfate solution including a reducing agent such as formaldehyde or hydrazine. As described above, since the horizontal growth of conductive patterns 485 is limited in hole arrays 470, conductive patterns 485 are vertically grown from seed layer patterns 483 in hole arrays 470. When the electroless plating process is continually performed, conductive patterns 485 fill hole arrays 470 and then grow horizontally and vertically on mold layer 465. Conductive patterns 485 filling hole arrays 470 continuously grow in the horizontal and vertical directions indicated by arrows so that adjacent conductive patterns 485 become connected to one another to form a conductive line 490 having a desired width and height.

Figure 10A:
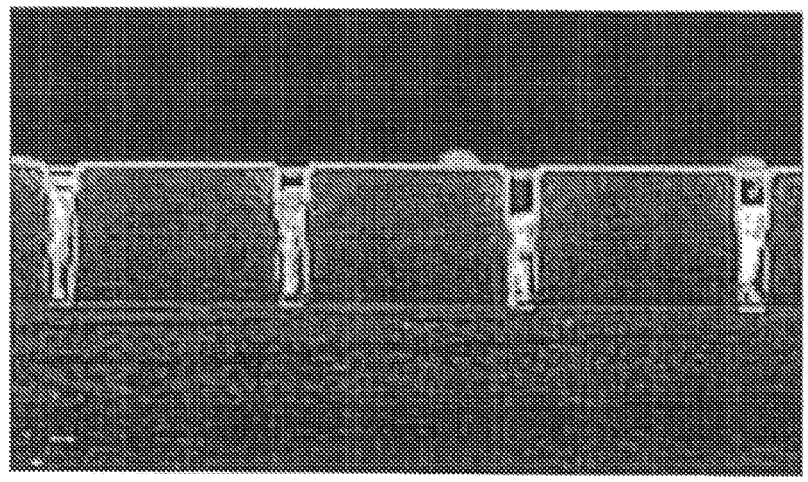
FIGS. 10A and 10B are electron micrograph images illustrating cross-sections of conductive patterns in FIG. 9D.
Figure 10B:
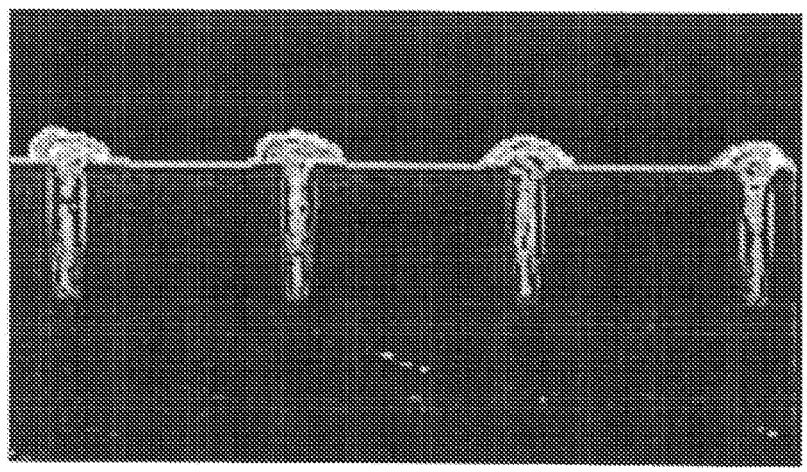

FIGS. 10A and 10B are electron micrograph images illustrating cross sections of conductive patterns 485 in FIG. 9D.

Referring to FIGS. 9D, 10A and 10B, as the electroless plating process proceeds, conductive patterns 485 grow vertically from seed layer patterns 483 to fill hole arrays 470.

Then, conductive patterns 485 grow vertically and horizontally on mold layer 465. In the present embodiment, conductive patterns 485 are formed by the electroless plating process, causing conductive patterns 485 have relatively dense structures.

Figure 9E:
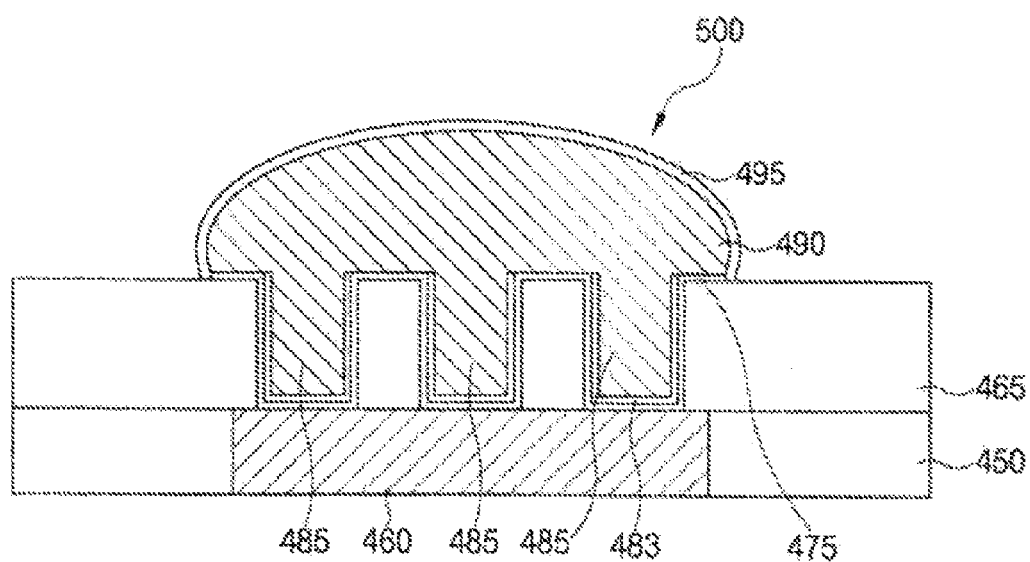

Referring to FIG. 9E, the electroless plating process is continually performed to connect adjacent conductive patterns 485 grown from seed layer patterns 483. Conductive patterns 485 grow continuously on mold layer 465 in vertical and horizontal directions and as a result adjacent conductive patterns 485 become connected to one another on mold layer 465. As shown in FIGS. 9D, 10A and 10B, after conductive patterns 485 grow from seed layer patterns 483 in the vertical direction, they grow on mold layer 465 in vertical and horizontal directions. Conductive line 490 is formed by connecting conductive patterns 485. The growth rate of conductive patterns 485 is typically adjusted after conductive patterns 485 fill the hole arrays 470, in order to form conductive line 490 with a desired width and height.

Referring now to FIG. 9E, a protection layer 495 having a thickness of about 100 to 1,000 Å is formed on mold layer 465 to enclose conductive line 490. Protection layer 495 may be formed using silicon carbide or silicon nitride.

A portion of protection layer 495 positioned on mold layer 465 is removed to complete protection layer 495 enclosing conductive line 490. As a result, an inductor 500 having spiral conductive lines 490 is formed on the substrate.

In one embodiment of the present invention, after the mold layer 465 is removed, protection layer 495 is formed to enclose conductive line 490. Since diffusion prevention layer 475 positioned beneath conductive line 490 is not removed, a sidewall of diffusion protection layer 475 is also enclosed by protection layer 495.

Figure 11:
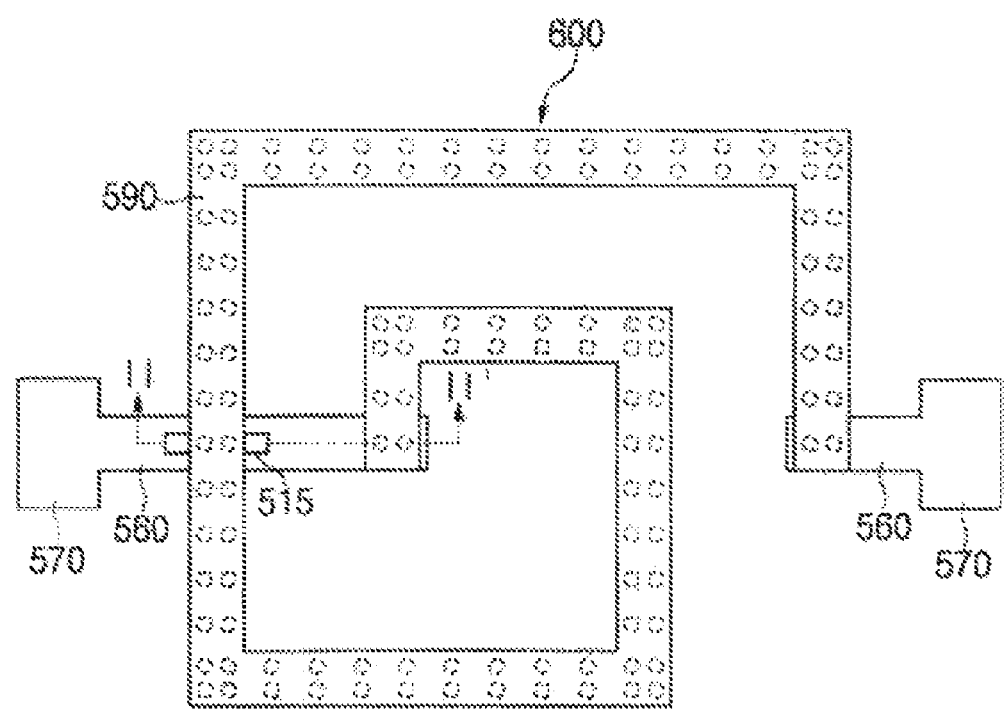
FIG. 11 is a planar view illustrating an exemplary inductor according to still another aspect of the present invention.
Figure 12:
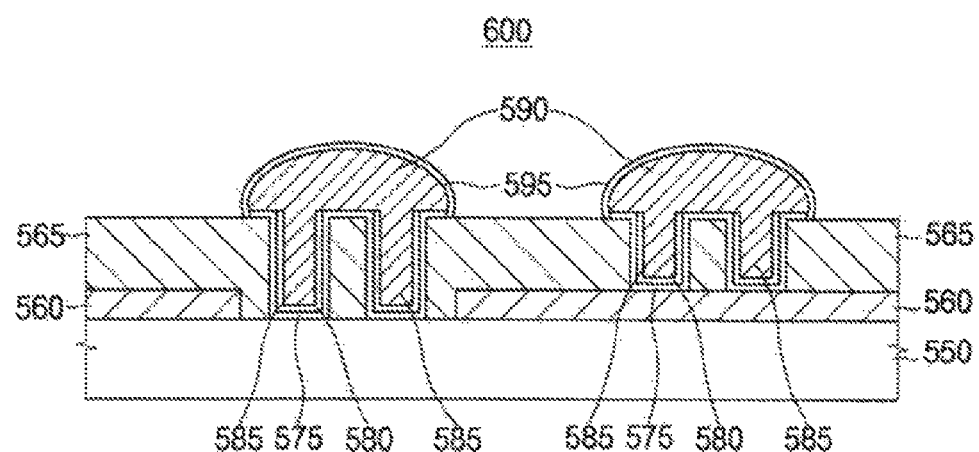
FIG. 12 is a cross-sectional view illustrating a section of the inductor shown in FIG. 11 taken along the line from II to II'; and, FIGS. 13A to 13D are cross-sectional views illustrating a method for manufacturing the inductor in FIG. 12.

FIG. 11 is a planar view illustrating an inductor in accordance with one embodiment of the present invention and FIG. 12 is a cross-sectional view illustrating a section of the inductor in FIG. 11 taken along the line extending from II to II'.

Referring to FIGS. 11 and 12, an inductor 600 includes a spiral conductive line 590 directly connected to a lower wiring 560 including pads 570 for input-output of electrical signals. In other words, in inductor 600, spiral conductive line 590 is directly connected to end portions (pads 570) of lower wiring 560 without an additional electrical contact connecting it to lower wiring 560. Omitting the additional electrical contact facilitates a simpler, lower-cost manufacturing processes because it eliminates the need for processes forming the contact.

An opening 515 is formed through a portion of lower wiring 560 where spiral conductive line 590 passes over it so as to prevent spiral conductive line 590 from connecting to lower wiring 560. Spiral conductive line 590 is directly connected to the end portions (pads 570) of lower wiring 560, whereas spiral conductive line 590 has no contact with lower wiring 560 because opening 515 is formed through the portion of lower wiring 560.

FIGS. 13A to 13D are cross-sectional views illustrating a method for manufacturing the inductor in FIG. 12.

Figure 13A:
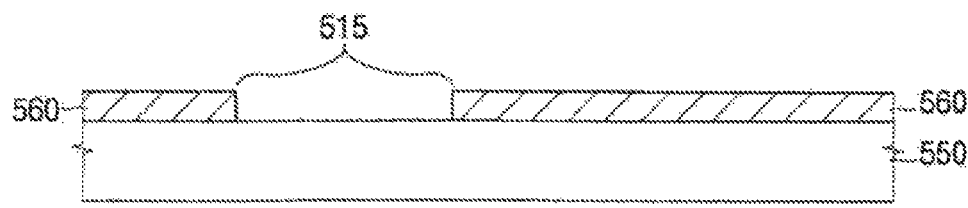

Referring to FIG. 13A, an insulation layer 550 is formed on a substrate including a lower conductive structure. Insulation layer 550 is typically formed using oxide or nitride.

A conductive layer is formed on insulation layer 550 using metal or doped polysilicon to form a lower wiring 560 on insulation layer 560. As shown in FIG. 11, the conductive layer is patterned to form lower wiring 560, which is electrically connected to the lower conductive structure. An opening 515 having a predetermined width is simultaneously formed through a portion of lower wiring 560 where a spiral conductive line 590 (see FIG. 13C) passes over it. Opening 515 preferably has a width slightly greater than a width of spiral conductive line 590.

Figure 13B:
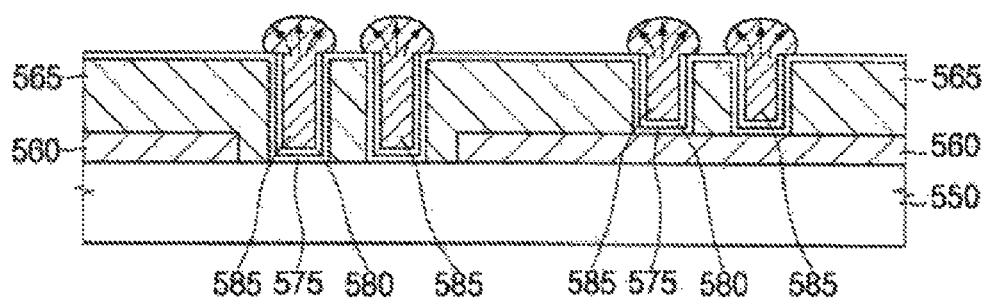

Referring to FIG. 13B, a mold layer 565 having a thickness of about 500 to 30,000 Å is formed on lower wiring 560 to fill opening 515. Mold layer 565 may be formed using oxide or photoresist. Mold layer 565 is partially etched to form a plurality of holes that simultaneously expose end portions (that is, pads) of lower wiring 560 and a portion of insulation layer 550 through opening 515. Each of the holes formed through mold layer 565 has a depth of about 500 to 30,000 Å. As described above, a photoresist film is additionally formed on mold layer 565 when mold layer 565 is formed using oxide. The photoresist film is exposed using a mask substantially similar to that of FIG. 4A or FIG. 4B to form a photoresist pattern including a plurality of holes. An ARL having a thickness of about 50 to 1,000 Å is typically additionally formed on the photoresist film. Mold layer 565 is then etched using the photoresist pattern as an etching mask to form the holes through mold layer 565. When mold layer 565 is formed using photoresist, mold layer 565 may be directly exposed using a mask substantially similar to that of FIG. 4A or FIG. 4B without forming an additional photoresist film, thereby forming the holes through mold layer 565, wherein the holes have inner surfaces. An additional ARL may be directly formed on mold layer 565 to ensure a process margin of a photolithography process.

A diffusion prevention layer 575 having a thickness of about 50 to 1,000 Å is formed on the exposed end portions of lower wiring 560, on the exposed portion of insulation layer 550, on the inner surfaces of the holes, and on mold layer 565. Diffusion prevention layer 575 typically has a single-layer structure or a multi-layer structure. The single-layer structure typically includes tantalum, tantalum nitride, tantalum-aluminum nitride, tantalum-silicon nitride, tantalum silicide, titanium, titanium nitride, tungsten nitride, titanium-silicon nitride, or an alloy thereof. The multi-layer structure typically includes at least two elements from the group consisting of tantalum, tantalum nitride, tantalum-aluminum nitride, tantalum-silicon nitride, tantalum silicide, titanium, titanium nitride, tungsten nitride, titanium-silicon nitride, and any alloy thereof.

A seed layer having a thickness of about 100 to 5,000 Å is formed on diffusion prevention layer 575 by a CVD process or a PVD process. The seed layer is preferably formed using copper, platinum, palladium, nickel, silver, gold, or an alloy thereof.

To achieve a selective electrolytic or electroless plating process, seed layer patterns 580 are formed on the inner surfaces of the holes and the end portions of lower wiring 560 by removing a portion of the seed layer positioned on mold layer 565. Seed layer patterns 580 may be formed by a CMP process, an etch back process, or a combination of a CMP process and an etch back process. Here, diffusion prevention layer 575, which is positioned on mold layer 565, is not etched. Hence, seed layer patterns 580 and diffusion prevention layer 575 are positioned on the inner surfaces of the holes, whereas only diffusion prevention layer 575 is positioned on mold layer 565.

Conductive patterns 585 are formed from seed layer patterns 580 to fill the holes by a selective electrolytic or electroless plating process. The selective electrolytic plating process is preferably performed with a current density of about 20 to about 40 mA/cm$^2$ using a plating solution that includes a copper sulfate solution, a sulfuric acid solution, and a solution including chlorine ions. The selective electroless plating process is preferably carried out using copper sulfate solution that includes a reducing agent such as formaldehyde or hydrazine.

Because horizontal growth of conductive patterns 585 may be limited in the holes, conductive patterns 585 are vertically grown from seed layer patterns 580 in the holes. The selective electrolytic or electroless plating process is continuously performed until conductive patterns 585 fill the holes and then it is continued in order to grow conductive patterns 585 in horizontal and vertical directions on mold layer 565. Conductive patterns 585 are continuously grown in horizontal and vertical directions indicated by arrows so that adjacent conductive patterns 585 become connected to one another.

Conductive patterns 585 are electrically connected to the end portions of lower wiring 560, whereas conductive patterns 585 are separated from another portion of the lower wiring 560 due to opening 515. That is, conductive patterns 585 are electrically isolated from lower wiring 560 except for the end portions of the lower wiring 560. As a result, the method of manufacturing inductor 600 (see FIG. 13C) may be simplified and performed at lower cost by omitting an additional process involved in the formation of a contact that electrically connects conductive patterns 585 to lower wiring 560.

Figure 13C:
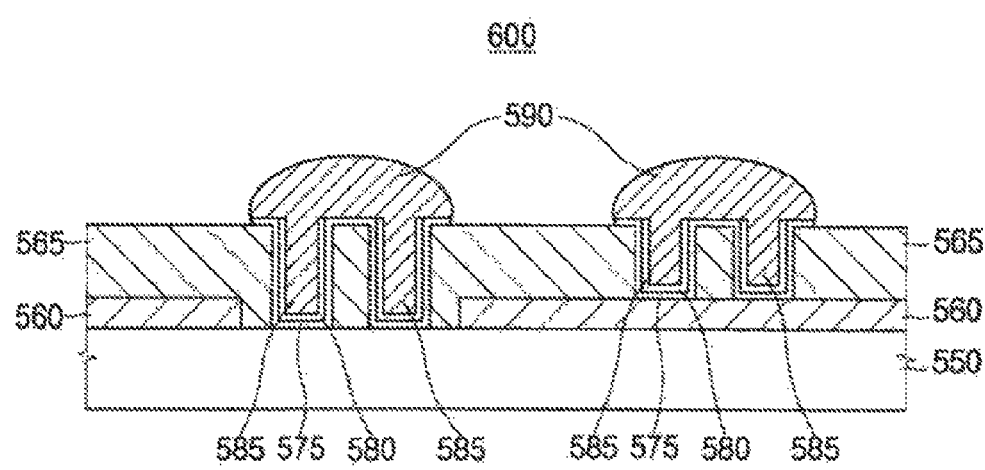

Referring to FIG. 13C, as the selective electrolytic or electroless plating process proceeds, after conductive patterns 585 vertically grow from the seed layer patterns 580 to fill the holes, conductive patterns 585 grow vertically and horizontally on mold layer 565. As a result, a conductive line 590 having a desired width and height is formed on mold layer 565 from seed layer patterns 580 by connecting conductive patterns 585. When conductive patterns 585 are formed by the selective electroless plating process, conductive patterns 585 may have relatively dense structures. Particularly, conductive patterns 585 continuously grow on mold layer 565 in the vertical and horizontal directions so that adjacent conductive patterns 585 are connected to one another on the mold layer 565. After conductive patterns 585 grow vertically from seed layer patterns 580, they grow vertically and horizontally on mold layer 565. Conductive line 590 is formed by the horizontal and vertical growth of conductive patterns 585. The growth rate of conductive patterns 585 is preferably adjusted after conductive patterns 585 fill the holes to form conductive line 590 with a desired width and height on mold layer 565.

Figure 13D:
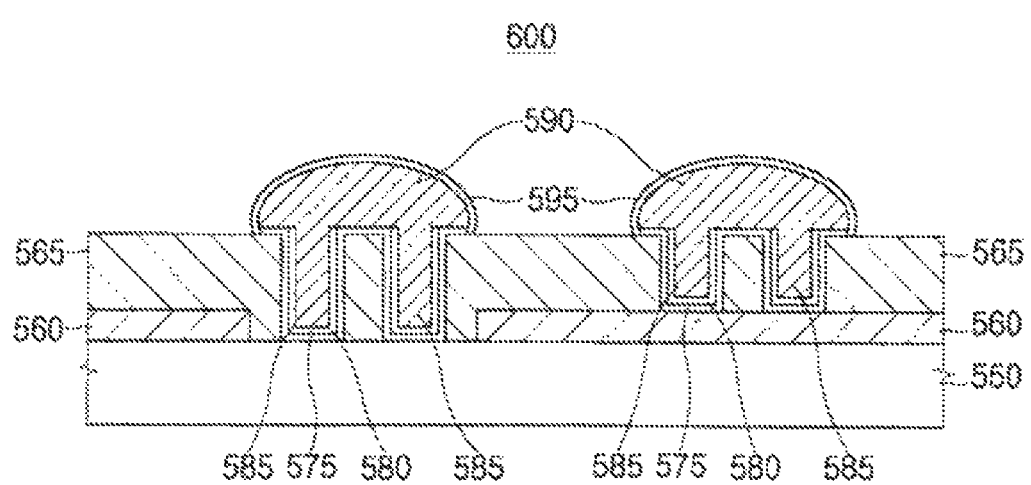

Referring now to FIG. 13D, after a portion of diffusion prevention layer 575 positioned on mold layer 565 is removed, a protection layer 595 having a thickness of about 100 to 1,000 Å is formed on mold layer 565 to enclose conductive line 590. Protection layer 595 may be formed using silicon carbide or silicon nitride. Thus, inductor 600, which has a plurality of spiral conductive lines 590, is formed on the substrate. In one embodiment of the present invention, after mold layer 565 is removed, protection layer 595 is formed to entirely enclose conductive line 590.

In summary, according to the present invention, an inductor including spiral conductive lines may be readily manufactured at a relatively low cost by employing an electrolytic process or an electroless plating process.

The inductor preferably includes a conductive line having a desired width and height obtained by adjusting a growth rate of conductive patterns grown with the electrolytic plating process or the electroless plating process.

Because the desired height of the conductive line is typically greater than that of a conventional inductor, the inductor may have a spiral structure characterized by a large height on a substrate.

The manufacturing time and cost required to form the inductor may be greatly reduced because an additional process typically required to electrically connect the inductor to a lower wiring formed on the substrate is omitted. The inductor may be directly formed on a conventional substrate without any additional process so that the inductor having the large height may be readily formed at low cost on the substrate using a conventional apparatus for manufacturing an inductor.

The preferred embodiments disclosed in the drawings and the corresponding written description are teaching examples. Those of ordinary skill in the art will understand that various changes in form and details may be made to the exemplary embodiments without departing from the scope of the present invention which is defined by the following claims.

What is claimed is:

1. A method for manufacturing an inductor, the method comprising:
   forming a mold layer on a seed layer, wherein the mold layer comprises a plurality of hole arrays exposing the seed layer;
   growing conductive patterns from the seed layer to fill the hole arrays by application of a plating process; and
   continuing application of the plating process after the conductive patterns fill the hole arrays until protrusions form on each one of the conductive patterns to extend over the mold layer, and until the protrusions amalgamate into a single conductive line on the mold layer,
   wherein the single conductive line as formed by the amalgamated protrusions is arranged to form the inductor.

2. The method of claim 1, wherein forming the mold layer comprises:
   forming a photoresist film on the seed layer; and
   forming a photoresist pattern on the seed layer by patterning the photoresist film, wherein the photoresist pattern includes the hole arrays that expose the seed layer.

3. The method of claim 2, wherein forming the photoresist pattern comprises:
   placing a mask over the photoresist film, the mask comprising a pattern having hole arrays arranged substantially in parallel; and,
   exposing the photoresist film using the mask.

4. The method of claim 2, further comprising:
   forming an anti-reflective layer on the photoresist film.

5. The method of claim 4, further comprising:
   removing the photoresist pattern and the anti-reflective layer after forming the conductive line.

6. The method of claim 5, wherein the photoresist pattern and the anti-reflective layer are removed using an organic stripper, a solution including ozone at a relatively high concentration, or a standard cleaning solution including carbon dioxide.

7. The method of claim 1, wherein forming the mold layer comprises:
   forming an oxide layer on the seed layer;
   forming a photoresist film on the oxide layer;
   forming a photoresist pattern on the oxide layer by patterning the photoresist film; and,
   forming the hole arrays through the mold layer by etching the mold layer using the photoresist pattern as an etching mask.

8. The method of claim 1, further comprising:
   forming a diffusion prevention layer between the seed layer and an underlying structure.

9. The method of claim 8, further comprising:
   partially removing the seed layer and the diffusion prevention layer except for portions of the seed layer and the diffusion prevention layer positioned beneath the conductive line after forming the conductive line.

10. The method of claim 9, wherein the seed layer and the diffusion prevention layer are partially removed using a solution including hydrogen fluoride and hydrogen peroxide or hydrogen fluoride and nitric acid.

11. The method of claim 1, further comprising:
    forming a protection layer on the conductive line.

12. A method of manufacturing an inductor, the method comprising:
    forming a mold layer on a substrate comprising a conductive structure, wherein the mold layer comprises hole arrays having inner surfaces;
    forming a diffusion prevention layer on the inner surfaces of the hole arrays and on the mold layer;
    forming seed layer patterns on portions of the diffusion prevention layer positioned in the hole arrays;
    growing conductive patterns from the seed layer patterns to fill the hole arrays by application of a plating process;
    continuing application of the plating process after the conductive patterns fill the hole arrays until protrusions form on each one of the conductive patterns to extend over the mold layer, and until the protrusions amalgamate into a single a conductive line on the mold layer; and
    forming a protection layer on the conductive line,
    wherein the conductive line formed by the amalgamated protrusions and as protected by the protection layer is arranged to form the inductor.

13. The method of claim 12, wherein forming the seed layer patterns comprises:
    forming a seed layer on the diffusion prevention layer; and
    removing portions of the seed layer positioned on the mold layer.

14. The method of claim 13, wherein removing the portions of the seed layer is performed by a chemical mechanical polishing (CMP) process, an etch back process, or a combination of a CMP process and an etch back process.

15. The method of claim 12, wherein the plating process is an electrolytic plating process or an electroless plating process.

16. A method of manufacturing an inductor, the method comprising:
    forming a mold layer on a substrate comprising a conductive structure, wherein the mold layer comprises hole arrays having inner surfaces;
    forming a diffusion prevention layer on the inner surfaces of the hole arrays and on the mold layer;
    forming a first seed layer on the diffusion prevention layer;
    forming a capping layer on the first seed layer;
    forming second seed layer patterns on portions of the capping layer positioned in the hole arrays;
    growing conductive patterns from the second seed layer patterns to fill the hole arrays by application of a plating process;
    continuing application of the plating process after the conductive patterns fill the hole arrays until protrusions form on each one of the conductive patterns to extend over the mold layer, and until the protrusions amalgamate into a single a conductive line on the mold layer; and
    forming a protection layer on the conductive line,
    wherein the conductive line as formed by the amalgamated protrusions and as protected by the protection layer is arranged to form the inductor.

17. The method of claim 16, wherein forming the second seed layer patterns comprises:
    forming a second seed layer on the capping layer; and
    removing portions of the second seed layer positioned on the mold layer.

* * * * *